United States Patent [19]

Shoji et al.

[11] Patent Number: 4,849,980
[45] Date of Patent: Jul. 18, 1989

[54] LASER BEAM RECORDING METHOD AND APPARATUS

[75] Inventors: Takashi Shoji; Takenori Tomita; Hideo Watanabe, all of Kanagawa, Japan

[73] Assignee: Fuji Photo Film Co., Ltd., Kanagawa, Japan

[21] Appl. No.: 137,222

[22] Filed: Dec. 23, 1987

[30] Foreign Application Priority Data

Dec. 29, 1986 [JP] Japan .................. 61-310247
Dec. 29, 1986 [JP] Japan .................. 61-310246
Jan. 14, 1987 [JP] Japan .................. 62-7328

[51] Int. Cl.⁴ .............................. H01S 3/13
[52] U.S. Cl. ......................... 372/29; 372/24; 372/26; 372/31; 372/38
[58] Field of Search ........... 372/29, 24, 33, 38, 372/25, 26, 30, 31, 32

[56] References Cited

U.S. PATENT DOCUMENTS

| | | | |
|---|---|---|---|
| 4,114,180 | 12/1978 | Kayanuma | 372/33 |
| 4,450,564 | 5/1984 | Meuleman et al. | 372/26 |
| 4,516,242 | 5/1985 | Yokota | 372/26 |
| 4,625,315 | 11/1986 | Lemberger et al. | 372/38 |
| 4,709,369 | 11/1987 | Howard | 372/38 |
| 4,710,631 | 12/1987 | Aotsuka et al. | 372/34 |
| 4,710,779 | 12/1987 | Funaki et al. | 372/29 |
| 4,718,068 | 1/1988 | Yoshikawa | 372/31 |
| 4,725,854 | 2/1988 | Ohtsuka et al. | 372/33 |
| 4,733,253 | 3/1988 | Daniele | 372/29 |
| 4,733,398 | 3/1988 | Shibagaki et al. | 372/26 |
| 4,734,914 | 3/1988 | Yoshikawa | 372/38 |
| 4,737,798 | 4/1988 | Lonis et al. | 372/29 |
| 4,745,609 | 5/1988 | Yoshikawa | 372/31 |
| 4,763,334 | 8/1988 | Shimada et al. | 372/38 |

FOREIGN PATENT DOCUMENTS

| | | | |
|---|---|---|---|
| 0052598 | 4/1977 | Japan | 372/24 |
| 0027380 | 3/1978 | Japan | 372/26 |
| 0012853 | 1/1979 | Japan | 372/24 |
| 0150289 | 11/1980 | Japan | 372/30 |
| 56-71374 | of 1981 | Japan | . |
| 115077 | of 1981 | Japan | . |
| 152372 | of 1981 | Japan | . |
| 0007489 | 1/1981 | Japan | 372/29 |
| 0101791 | 8/1981 | Japan | 372/24 |
| 0000984 | 1/1984 | Japan | 372/31 |
| 0050590 | 3/1984 | Japan | 372/38 |
| 0063787 | 4/1984 | Japan | 372/29 |
| 0239925 | 11/1985 | Japan | 372/38 |
| 0020383 | 1/1986 | Japan | 372/38 |
| 0183983 | 8/1986 | Japan | 372/29 |

Primary Examiner—William L. Sikes
Assistant Examiner—Xuan Thi Vo
Attorney, Agent, or Firm—Sughrue, Mion, Zinn, Macpeak, and Seas

[57] ABSTRACT

A laser beam recording method and apparatus are constituted for recording an image by obtaining a laser beam whose optical intensity is modulated by controlling a drive current for a semiconductor laser on the basis of a light emission level instructing signal corresponding to an image signal, and scanning the laser beam on a photosensitive material. The optical output is stabilized by detecting the optical intensity of the laser beam and feeding back a feedback signal corresponding to the detected optical intensity to the light emission level instructing signal. A filter circuit formed so that the gain gradually increases from near to a cutoff frequency of a circuit for the optical output stabilization toward a higher frequency side is disposed in a stage prior to the circuit for the optical output stabilization. Or, a bias current of a value smaller than the value of the drive current that produces the laser beam of the minimum optical intensity capable of exciting the photosensitive material is always fed to the semiconductor laser.

9 Claims, 6 Drawing Sheets

F I G. 2
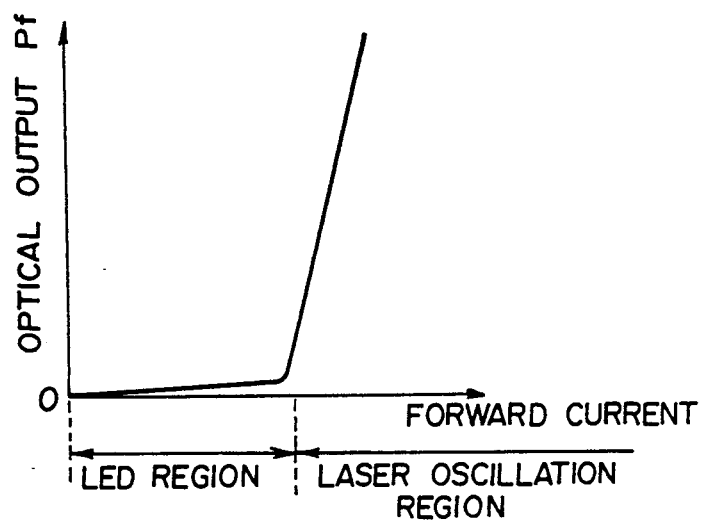
F I G. 3
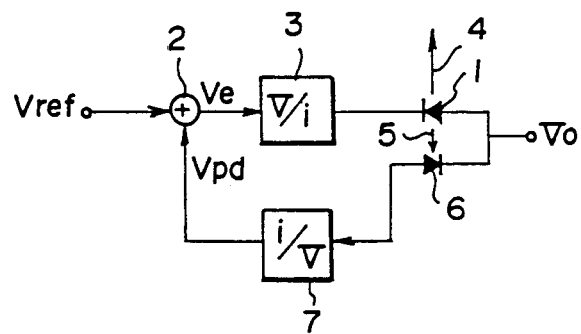

F I G. 4
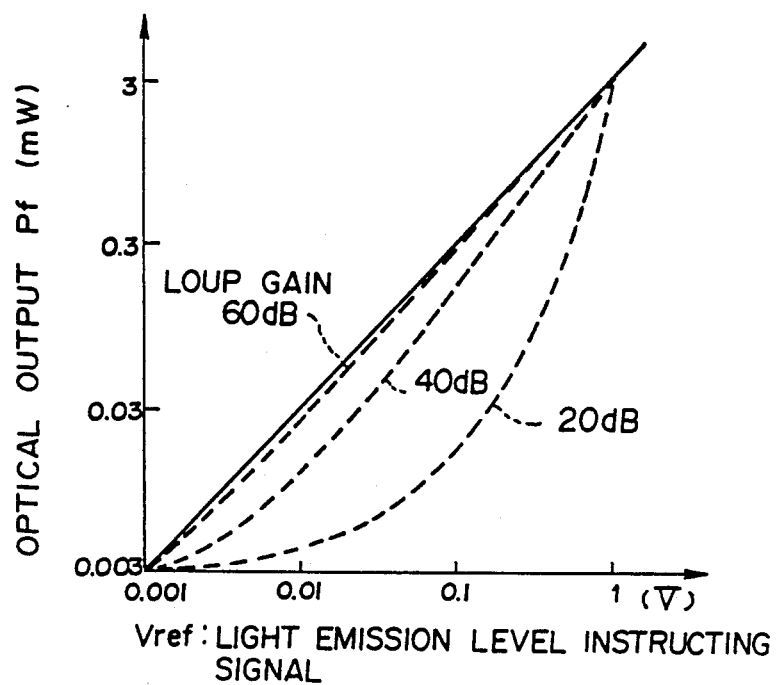
F I G. 5
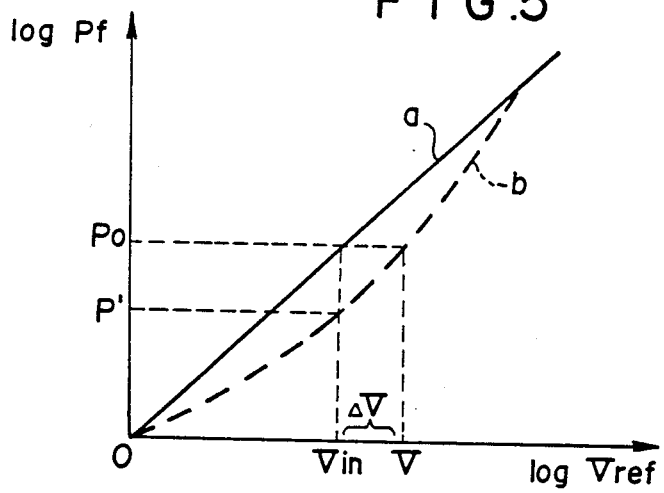

FIG. 9
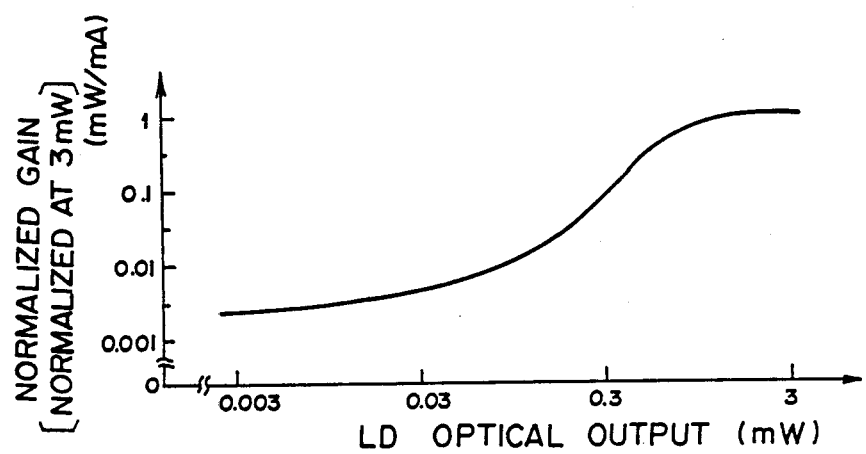
FIG. 10A
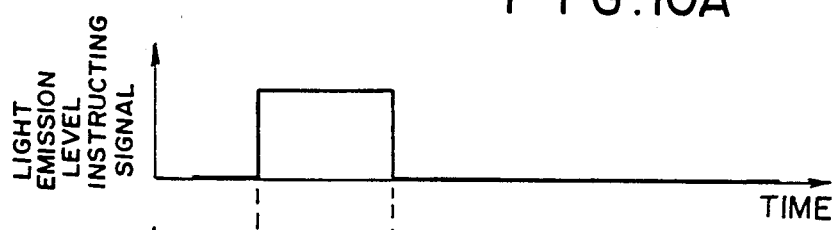
FIG. 10B
FIG. 10C
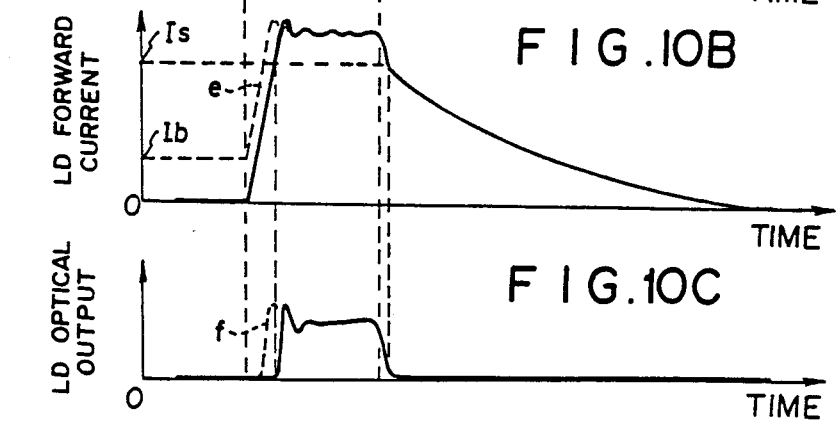

LASER BEAM RECORDING METHOD AND APPARATUS

BACKGROUND OF THE INVENTION

1. Field of the Invention

This invention relates to a laser beam recording method for recording a continuous tone image on a photosensitive material by scanning the photosensitive material with a laser beam modulated in accordance with an image signal, and an apparatus for carrying out the method. This invention particularly relates to a laser beam recording method for recording an image of high gradation by analog modulation of the optical intensity of the laser beam, and an apparatus for carrying out the method.

2. Description of the Prior Art

Light beam scanning recording apparatus wherein a light beam is deflected by a light deflector and scanned on a photosensitive material for recording an image on the photosensitive material have heretofore been used widely. A semiconductor laser is one of the means used for generating a light beam in the light beam scanning recording apparatuses. The semiconductor laser has various advantages over a gas laser or the like in that the semiconductor laser is small, cheap and consumes little power, and that the laser beam can be modulated directly by changing the drive current.

FIG. 2 is a graph showing the optical output characteristics of the semiconductor laser with respect to the drive current. With reference to FIG. 2, the optical output characteristics of the semiconductor laser with respect to the drive current change sharply between a LED region (natural light emission region) and a laser oscillation region. Therefore, it is not always possible to apply the semiconductor laser to recording of a continuous tone image. Specifically, in the case where intensity modulation is carried out by utilizing only the laser oscillation region in which the optical output characteristics of the semiconductor laser with respect to the drive current are linear, it is possible to obtain a dynamic range of the optical output of only approximately 2 orders of ten at the most. As is well known, with a dynamic range of this order, it is impossible to obtain a continuous tone image of high quality.

Accordingly, as disclosed in, for example, Japanese Unexamined Patent Publication Nos. 56(1981)-115077 and 56(1981)-152372, an attempt has been made to obtain a continuous tone image by maintaining the optical output of the semiconductor laser constant, continuously turning on and off the semiconductor laser to form a pulsed scanning beam, and controlling the number or the width of pulses for each picture element to change the scanning light amount.

However, in the case where the pulse number modulation or the pulse width modulation as mentioned above is carried out, in order to obtain a density scale, i.e. a resolution of the scanning light amount, of 10 bits (approximately 3 order of ten) when the picture element clock frequency is 1 MHz for example, the pulse frequency must be adjusted to a very high level (at least 1 GHz). Though the semiconductor laser itself can be turned on and off at such a high frequency, a pulse counting circuit or the like for control of the pulse number or the pulse width cannot generally be operated at such a high frequency. As a result, it becomes necessary to decrease the picture element clock frequency to a value markedly lower than the aforesaid value. Therefore, the recording speed of the apparatus must be decreased markedly.

Also, with the aforesaid method, the heat value of the semiconductor laser chip varies depending on the number of the widths of the pulses which are emitted during the recording period of each picture element, so that the optical output characteristics of the semiconductor laser with respect to the drive current change, and the exposure amount per pulse fluctuates. As a result, the gradation of the recorded image deviates from the correct gradation, and a continuous tone image of a high quality cannot be obtained.

On the other hand, as disclosed in Japanese Unexamined Patent Publication No. 56(1981)-71374 for example, it has been proposed to record a high-gradation image by combining pulse number modulation or pulse width modulation with optical intensity modulation. However, also with the proposed method, the heat value of the semiconductor laser chip varies depending on the number of the widths of the pulses which are emitted during the recording period of each picture element, so that the exposure amount per pulse fluctuates.

In view of the above, in order to record a high-gradation image of a density scale of approximately 10 bits, i.e. approximately 1024 levels of gradation, it is desired that a dynamic range of the optical output be adjusted to approximately 3 orders of ten by carrying out optical intensity modulation over the LED region and the laser oscillation region as shown in FIG. 2. However, the optical output characteristics of the semiconductor laser with respect to the drive current are not linear over the two regions. Therefore, in order to control the image density at an equal density interval for a predetermined difference among the image signals so that a high-gradation image can be recorded easily and accurately, it is necessary to make linear the relationship between the light emission level instructing signal and the optical output of the semiconductor laser by compensation of the optical output characteristics of the semiconductor laser with respect to the drive current.

As a circuit for making linear the relationship between the light emission level instructing signal and the optical output of the semiconductor laser, it has heretofore been known to use an optical output stabilizing circuit (an automatic power control circuit, hereinafter abbreviated to the APC circuit) for detecting the optical intensity of a laser beam and feeding back a feedback signal, which corresponds to the detected optical intensity, to the light emission level instructing signal for the semiconductor laser. FIG. 3 is a block diagram showing an example of the APC circuit. The APC circuit will hereinbelow be described with reference to FIG. 3. A light emission level instructing signal Vref for instructing the optical intensity of a semiconductor laser 1 is fed to a voltage-to-current conversion amplifier 3 via an addition point 2. The amplifier 3 feeds a drive current proportional to the light emission level instructing signal Vref to the semiconductor laser 1. A laser beam 4 emitted forward by the semiconductor laser 1 is utilized for scanning a photosensitive materia via a scanning optical system (not shown). On the other hand, the intensity of a laser beam 5 emitted rearward from the semiconductor laser 1 is detected by a pin photodiode 6 disposed for optical amount monitoring, for example in a case housing the semiconductor laser 1. The intensity of the laser beam 5 thus detected is proportional to the intensity of the laser beam 4 actually utilized for image recording. The output current of the pin photodiode 6 which represents the intensity of the laser beam 5, i.e. the intensity of the laser beam 4, is converted into a feedback signal (voltage signal) Vpd by a current-to-voltage conversion amplifier 7, and the feedback signal Vpd is sent to the addition point 2. From the addition point 2, a deviation signal Ve representing a deviation between the light emission level instructing signal Vref and the feedback signal Vpd is output. The deviation signal Ve is converted into a current signal by the voltage-to-current amplifier 3 and is utilized for operating the semiconductor laser 1.

In the case where the loop gain of the APC circuit constituted by the loop passing through the addition point 2, the voltage-to-current conversion amplifier 3, the semiconductor laser 1, the photodiode 6, and the current-to-voltage conversion amplifier 7 and then returning to the addition point 2 is adjusted to a substantially high level, the relationship between the light emission level instructing signal and the optical output of the semiconductor laser becomes linear.

In the APC circuit constituted by the feedback loop as mentioned above, the light emission response characteristics of the semiconductor laser become higher the wide the band is, and become lower the narrower the band is. Also, the LD is a gain change element, so that the band of the APC circuit becomes wider and the response characteristics increase the higher the optical output is. That is, at the time of a low output, problems with regard to low response characteristics arise and the sharpness deteriorates. Though no problem would be caused if the band of the APC circuit could be increased on the overall optical amount level, an increase of the band is actually limited by the high-frequency characteristics of the operational amplifier, the junction capacitance of the photodetector, and other factors.

One approach to elimination of the aforesaid problems is to design the circuit so that the cutoff frequency of the APC circuit is adjusted to be as high as possible to increase the response characteristics at a low output. However, in this case, the loop gain of the APC circuit cannot be adjusted to a high level, and it is not always possible to make linear the relationship between the light emission level instructing signal and the optical output of the semiconductor laser.

With the aforesaid APC circuit, the intensity of the lser beam 5 is proportional to the light emission level instructing signal Vref in the case where ideal linearity compensation is effected. Specifically, the intensity Pf of the laser beam 4 (i.e. the optical output of the semiconductor laser 1) utilized for image recording is proportional to the light emission level instructing signal Vref.

However, when analog modulation of the optical intensity of the laser beam is carried out over the LED region and the laser oscillation region of the semiconductor laser by use of the APC circuit as mentioned above, there arises the problem that the rise response of the optical output of the semiconductor laser slows down at the time when, for example, a sharp light emission instruction is given for activating laser oscillation from the condition when no light is being emitted. Specifically, as shown in FIG. 9 for example, the normalized gain of the semiconductor laser which is one of the factors affecting the loop gain of the APC circuit becomes very low in the low output region of the semiconductor laser. As the normalized gain of the semiconductor laser becomes very low, the loop gain of the APC circuit decreases markedly. For this reason, with respect to a pulsed light emission level instructing signal as shown in FIG. 10A, a response delay arises with the forward current of the semiconductor laser as indicated by the solid line in FIG. 10B. Therefore, a comparatively long time is taken for the forward current of the semiconductor laser to increase up to a threshold current Is at which the laser oscillation begins, and the rise response of the optical output of the semiconductor laser is delayed as shown in FIG. 10C.

In the case where the rise of the optical output of the semiconductor laser is delayed as mentioned above, even through the duty ratio of the pulsed light emission level instructing signal is adjusted to 50%, for example in the case of high-speed modulation, and the exposure amount at each picture element is controlled based on said duty ratio, the duty ratio of the light pulse actually irradiated onto the photosensitive material does not come up to 50%, and the line of the recorded image becomes thin. Also, the rise time taken for the optical ouput to come up to a level P1 from the condition when the laser is emitting light to some extent and the time taken for the optical output to come up to the level P1 from the condition when the laser is off are different from each other, and therefore the recording start position deviates and a gap is caused in the recorded image.

SUMMARY OF THE INVENTION

The primary object of the present invention is to provide a laser beam recording method wherein the light emission response characteristics of a semiconductor laser are increased without the loop gain of an APC circuit being decreased, thereby to enable recording of an image of high sharpness to take place.

Another object of the present invention is to provide a laser beam recording method wherein the response characteristics of a semiconductor laser at the rise of optical output is enhanced, thereby to make possible the recording of an image with good image reproducibility.

The specific object of the present invention is to provide an apparatus for carrying out the laser beam recording method.

The present invention provides a laser beam recording method which comprises the following steps, in the course of obtaining a laser beam whose optical intensity is modulated by controlling a drive current for a semiconductor laser on the basis of a light emission level instructing signal corresponding to an image signal, and recording an image on a photosensitive material by scanning the laser beam on the photosensitive material:

(i) stabilizing the optical output by detecting the optical intensity of said laser beam and feeding back a feedback signal corresponding to the detected optical intensity to said light emission level instructing signal, and (ii) gradually increasing the gain in a stage prior to the stage for said optical output stabilization from near to a cutoff frequency in said optical output stabilization toward a higher frequency side.

The present invention also provides a laser beam recording apparatus provided with a semiconductor laser for emitting a laser beam, a beam scanning system for scanning the laser beam on a photosensitive material, and a laser operation control circuit for producing a light emission level instructing signal corresponding to an image signal, and controlling a drive current for the semiconductor laser on the basis of the light emission level instructing signal, thereby to modulate the optical intensity of the laser beam, wherein the improvement comprises providing said laser operation control circuit with:
  (i) an optical output stabilizing circuit for detecting the optical intensity of said laser beam, and feeding back a feedback signal corresponding to the detected optical intensity to said light emission level instructing signal, and
  (ii) a filter circuit disposed to allow the passage of said light emission level instructing signal therethrough in a stage prior to said optical output stabilizing circuit, and formed so that the gain gradually increases from near to a cutoff frequency of said optical output stabilizing circuit toward a higher frequency side.

The present invention further provides a laser beam recording method which comprises the following steps, in the course of obtaining a laser beam whose optical intensity is modulated by controlling a drive current for a semiconductor laser on the basis of a light emission level instructing signal corresponding to an image signal, and recording an image on a photosensitive material by scanning the laser beam on the photosensitive material:
  (i) stabilizing the optical output by detecting the optical intensity of said laser beam and feeding back a feedback signal corresponding to the detected optical intesity to said light emission level instructing signal, and
  (ii) always feeding a bais current of a value smaller than the value of said drive current, that produces said laser beam of the minimum optical intensity capable of exciting said photosensitive material, to said semiconductor laser.

The second-mentioned laser beam recording method in accordance with the present invention is carried out by an apparatus provided with a semiconductor laser for emitting a laser beam, a beam scanning system for scanning the laser beam on a photosensitive material, and a laser operation control circuit for producing a light emission level instructing signal corresponding to an image signal, and controlling a drive current for the semiconductor laser on the basis of the light emission level instructing signal, thereby to modulate the optical intensity of the laser beam, wherein the improvement comprises providing said laser operation control circuit with:
  (i) an optical output stabilizing circuit for detecting the optical intensity of said laser beam, and feeding back a feedback signal coresponding to the detected optical intensity to said light emission level instructing signal, and
  (ii) a bias current feed means for always feeding a bias current of a value smaller than the value of said drive current, that produces said laser beam of the minimum optical intensity capable of exciting said photosensitive material, to said semiconductor laser.

As the filter circuit in the first-mentioned laser beam recording apparatus in accordance with the present invention, a lead-lag filter or the like may be used.

With the first-mentioned laser beam recording method and apparatus in accordance with the present invention, the band of the system including the filter circuit and the APC circuit becomes wider than the band of the APC circuit alone. Therefore, the light emission response characteristics of the semiconductor laser can be enhanced, and a continuous tone image of a high image quality with high sharpness can be recorded. Also, the effects of improving the light emission response characteristics are obtained by the filter circuit disposed in the stage prior to the APC circuit, and there is no risk of the loop gain of the APC circuit being decreased for the purpose of obtaining said effects. Accordingly, with the first-mentioned laser beam recording method and apparatus in accordance with the present invention, the relationship between the light emission level instructing signal and the optical output of the semiconductor laser can be kept linear, and a fine continuous tone image having a high density resolution can be recorded.

With the second-mentioned laser beam recording method and apparatus in accordance with the present invention wherein the bias current is always fed to the semiconductor laser, the time required for the forward current of the semiconductor laser to increase to a predetermined value when the pulsed light emission level instructing signal is given to the laser operation control circuit is reduced, and the rise response of the optical output becomes quicker. Specifically, at the time an instruction for high-level light emisison is given to the semiconductor laser in the condition when no light is being emitted, the optical output of the semiconductor laser rises quickly with only a short response lag. Accordingly, with the second-mentioned laser beam recording method and apparatus in accordance with the present invention, the duty ratio of the image recording laser beam approaches the duty ratio of the light emission level instructing signal, and an image can be recorded with good image reproducibility.

BRIEF DESCRIPTION OF THE DRAWINGS

FIG. 2 is a graph showing the optical output characteristics of a semiconductor laser with respect to the drive current, FIG. 3 is a block diagram showing an example of the circuit for stabilizing the optical output of the semiconductor laser, FIG. 4 is a graph showing the relationship between a light emission level instructing signal and the optical output of the semiconductor laser, FIG. 5 is an explanatory graph showing the effects of the V-P characteristics correction table in the embodiment shown in FIG. 1.

FIG. 9 is a graph showing the relationship between the optical output of the semiconductor laser and the normalized gain, and FIGS. 10A, 10B and 10C are explanatory graphs showing the effects of the bias current in the embodiment shown in FIG. 8.

DESCRIPTION OF THE PREFERRED EMBODIMENTS

The present invention will hereinbelow be described in further detail with reference to the accompanying drawings.

Figure 1:
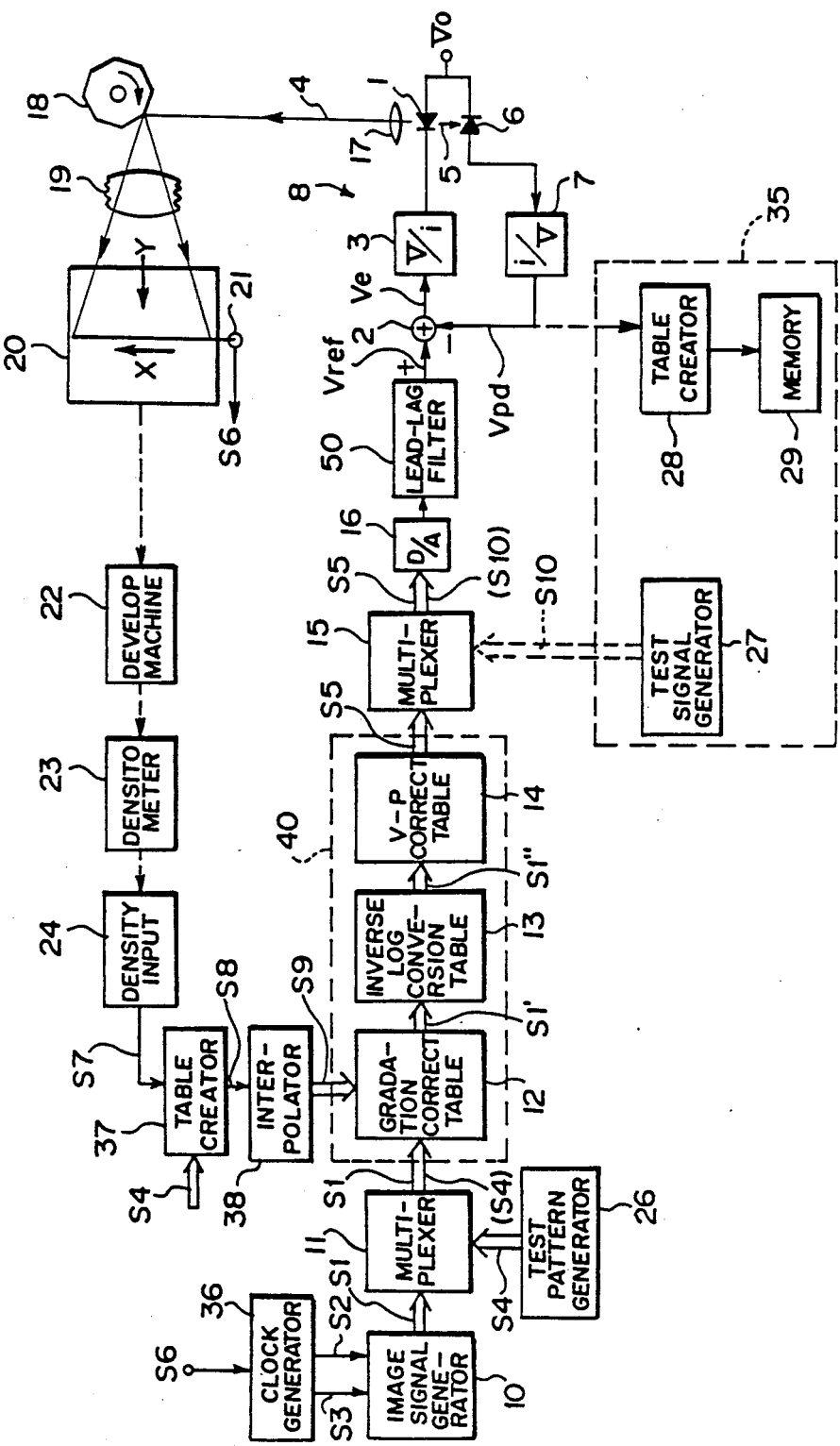
FIG. 1 is a schematic view showing an embodiment of the first laser beam recording apparatus in accordance with the present invention.

With reference to FIG. 1, an imaqge signal generator 10 generates an image signal S1 representing a continuous tone image. By way of example, the image signal S1 is a digital signal representing a continuous tone image of a density scale of 10 bits. The image signal generator 10 changes over the signal for a single main scanning line on the basis of a line clock S2 as will be described later, and emits the image signal S1 at each picture element based on a picture element clock S3. In this embodiment, the picture element clock frequency is adjusted to 1MHz. In other words, the recording time for a single picture element is adjusted to 1μsec.

The image signal S1 is corrected as will be described below by a correction table 40 comprising a RAM via a multiplexer 11, and is converted into a light emission level instructing signal S5 of, for example, 16 bits. The light emission level instruction signal S5 is fed to a multiplexer 15 and then to a D/A converter 16, and is converted by the D/A converter 16 into a light emission level instructing signal Vref composed of an analog voltage signal. The light emission level instructing signal Vref is fed to an addition point 2 of an APC circuit 8. A voltage-to-current conversion amplifier 3, a semiconductor laser 1, a photodiode 6, and a current-to-voltage conversion amplifier 7 of the APC circuit 8 operate in the same manners as the ones in the circuit mentioned above with reference to FIG. 3. Therefore, a laser beam 4 of an intensity corresponding to the light emission level instructing signal Vref, i.e. to the image signal S1, is emitted by the semiconductor laser 1. In this embodiment, a lead-lag filter 50 through which the light emission level instructing signal Vref is to be passed is disposed in the stage prior to the addition point 2. Operations of the leadlag filter 50 will be described later.

The laser beam 4 is collimated by a collimator lens 17, and is then reflected and deflected by a light deflector 18 constituted by a polygon mirror or the like. The laser beam 4 thus deflected is passed through a converging lens 19 normally constituted by an fθ lens, is converged into a minute spot on a photosensitive material 20, and scans the photosensitive material 20 in a main scanning direction as indicated by the arrow X. The photosensitive material 20 is moved by a movement means (not shown) in a sub-scanning direction as indicated by the arrow Y approximately normal to the main scanning direction X, and thus is scanned with the laser beam 4 in the sub-scanning direction Y. In this manner, the photosensitive material 20 is two-dimensionally scanned with and exposed to the laser beam 4. Since the laser beam 4 is intensity modulated based on the image signal S1 as mentioned above, the continuous tone image which the image signal S1 represents is recorded as a photographic latent image on the photosensitive material 20. When the laser beam 4 scans on the photosensitive material 20, passage of the laser beam 4 over a start point of the main scanning is detected by a photodetector 21, and a start point detection signal S6 generated by the photodetector 21 is fed to a clock generator 36. The clock generator 36 emits the aforesaid line clock S2 and the picture element clock S3 in synchronization with the input timing of the start point detection signal S6.

Then, the photosensitive material 20 is sent to a developing machine 22 and is subjected to development processing. Thus the continuous tone image is developed as a visible image on the photosensitive material 20.

Correction of the image signal S1 by the correction table 40 will be described hereinbelow. The correction table 40 comprises a gradation correction table 12, an inverse logarithmic conversion table 13, and a correction table 14 (hereinafter referred to as the V-P characteristics correction table) of making linear the optical output characteristics of the semiconductor laser 1 with respect to the light emission level instructing signal. The gradation correction table 12 is of the known type for correcting the gradation chracteristics of the photosensitive material 20 and the development processing system. The gradation correction table 12 may be of the fixed correction characteristics type. However, in this embodiment, by taking into consideration changes in the gradation characteristics of the photosensitive material 20 among the lots thereof, changes in the characteristics of the developing solution in the developing machine 22 with the passage of time, or the like, the gradation correction table 12 is constituted for changing the correction characteristics when necessary in accordance with the actual gradation characteristics. Specifically, a test pattern signal S4 representing some steps (e.g. 16 steps) of image density on the photosensitive material 20 is generated by a test pattern generating circuit 26, and is fed to the multiplexer 11. At this time, the multiplexer 11 is changed over from the condition at the time of image recording for feeding the image signal S1 to the correction table 40 as mentioned above to the condition for feeding the test pattern signal S4 to the correction table 40. The semiconductor laser 1 is operated in the manner mentioned above on the basis of the test pattern signal S4, and therefore the laser beam 4 is intensity modulated. As a result, a step wedge (test pattern) whose density changes step-wise, for example in 16 steps, is recorded as a photographic latent image on the photosensitive material 20. The photosensitive material 20 is sent to the developing machine 22, and the step wedge is developed. After the development is finished, the photosensitive material 20 is sent to a densitometer 23, and the optical density at each step of the step wedge is measured. The optical density thus measured is sent to a density value input means 24 in conformity with each step of the step wedge, and a density signal S7 representing the optical density of each step of the step wedge is generated by the density value input means 24. The density signal S7 is fed to a table creation means 37. On the basis of the density signal S7 and the test pattern signal S4, the table creation means 37 creates the gradation correction table such that a predetermined image density is obtained with a predetermined value of the image signal S1. As mentioned above, the gradation correction table makes the image signal values of approximately 16 steps correspond respectively to predetermined image density values. A signal S8 representing the gradation correction table is fed to a signal interpolation means 38, which carries out interpolation processing to obtain a gradation correction table adapted to the image signal S1 of 1024 steps (i.e. 10 bits). The aforesaid gradation correction table 12 is created on the basis of a signal S9 representing the gradation correction table thus obtained.

In the course of image recording based on the image signal S1, the image signal S1 fed to the gradation correction table 12 via the multiplexer 11 is converted to a signal S1∝ by the gradation correction table 12, and is then converted by the inverse logarithmic conversion table 13 into a light emission level instructing signal S1''.

The V-P characteristics correction table 14 will now be described below. Even though the feedback signal Vpd is fed back to the addition point 2 in the APC circuit 8, it is not always possible to obtain the ideal relationship between the light emission level instructing signal and the intensity of the laser beam 4 as indicated by the solid line in Figure 4. Specifically, in order to obtain the ideal relationship, it is necessary to adjust the loop gain of the APC circuit to a very high value (approximately 70dB). However, it is not always possible to realize such a high loop gain with the present technique. The V-P characteristics correction table 14 is provided for obtaining such as ideal relationship. Specifically, the ideal relationship between the light emission level instructing signal Vref and the optical output of the semiconductor laser 1 is indicated by a straight line "a" in FIG. 5, the actual relationship therebetween is indicated by a curve "b" in FIG. 5, and the voltage value at the time the light emission level instructing signal S1'' is directly D/A converted is assumed to be equal to Vin. In this case, the V-P characteristics correction table 14 is constituted to convert the voltage value Vin to a voltage value V. When the value of the light emission level instructing signal Vref is equal to Vin, only the optical intensity equal to P' can be obtained. However, in the case where the voltage value Vin is converted to the voltage value as mentioned above, the optical intensity equal to Po can be obtained with respect to the voltage value Vin. Thus the relationship between the voltage value Vin corresponding to the light emission level instructing signal S1'' and the optical output Pf becomes linear.

With the aforesaid configuration, density on the photosensitive material 20 can be controlled at equal density intervals by changing the level of the image signal S1 by a predetermined amount. Also, as mentioned above, the characteristics curve "b" shown in FIG. 5 is for the case where the semiconductor laser 1 is operated over the LED region and the laser oscillation region. Therefore, with the aforesaid embodiment, an optical output dynamic range of approximately 3 orders of ten can be obtained, and consequently a high-gradation image of approximately 1024 levels of gradation can be recorded easily and accurately as mentioned above.

As mentioned above, nonlinearity of the laser beam optical output characteristics with respect to the light emission level instructing signal, which nonlinearity is caused by nonlinearity of the optical output characteristics of the semiconductor laser 1 with respect to the drive current, is eliminated and said characteristics are made linear by the V-P characteristics correction table 14. Accordingly, the loop gain of the APC circuit 8 constituted by the system passing through the voltage-to-current conversion amplifier 3, the semiconductor laser 1, the photodiode 6, and the current-to-voltage conversion amplifier 7 and then returning to the addition point 2 need not include the gain necessary for the correction for eliminating the aforesaid nonlinearity. Thus it is not only necessary that the loop gain be of a value required for the compensation for deviations of the optical output characteristics of the semiconductor laser 1 with respect to the drive current which are caused by transitional changes in the temperature arising in the course of the operation of the semiconductor laser 1 or by error and/or hunting in the control for making constant the temperature in the case of the semiconductor laser 1, and for the compensation for drifts of the amplifiers or the like. Specifically, in the case where the picture element clock frequency is 1MHz and the semiconductor laser 1 is operated to generate an optical output of 3mW, it is only necessary that the aforesaid loop gain be approximately 30dB. The loop gain of this order can be achieved easily with the present technical level.

Creation of the V-P characteristics correction table 14 will be described hereinbelow. To the apparatus shown in FIG. 1, a table creation device 35 can be connected when necessary. The table creation device 35 comprises a test signal generating circuit 27, a table creation circuit 28 and a memory 29. When the V-P characteristics correction table 14 is to be created, a variable-level digital test signal S10 is generated by the test signal generating circuit 27 and is fed to the multiplexer 15. At this time, the multiplexer 15 is changed over from the condition for feeding the light emission level instructing signal S5 to the D/A converter 16 in the course of image recording to the condition for feeding the test signal S10 to the D/A converter 16. Also, the table creation circuit 28 is connected so that it receives the feedback signal Vpd from the current-to-voltage conversion amplifier 7 of the APC circuit 8. The test signal S10 is emitted such that the signal level increases or decreases step-wise. At this time, the table creation circuit 28 activates a variable-level signal generator built therein to generate a reference signal corresponding to the minimum optical output, and compares the feedback signal Vpd with the reference signal. The reference signal has the voltage value Vin as shown in FIG. 5. The table creation circuit 28 latches the value of the test signal S10 at the time the feedback signal Vpd and the reference signal coincide with each other. The voltage value represented by the latched test signal S10 corresponds to the voltage value V as shown in FIG. 5, and therefore the relationship between the voltage value Vin and the voltage value V can be found. The table creation circuit 28 changes the value of the reference signal in 1024 steps, and detects the relationship between the voltage value Vin and the voltage value V for each reference signal value. In this manner, the correction table for converting 1024 levels of the voltage value Vin to the voltage value V is created. The creation table thus created is stored in the memory 29, and is then set as the V-P characteristics correction table 14. After the V-P characteristics correction table 14 is created in this manner, the table creation device 35 is disconnected from the APC circuit 8.

Figure 6:
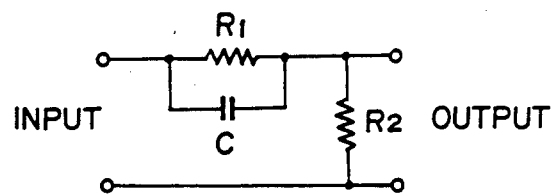
FIG. 6 is a circuit diagram of the lead-lag filter used in the embodiment shown in FIG. 1, FIG. 7A, 7B and 7C are explanatory graphs showing the effects of the lead-lag filter.

The effect of the lead-lag filter 50 will now be described below. The lead-lag filter 50 is constituted by, for example, a passive filter having a circuit configuration as shown in FIG. 6. As shown in FIG. 7B, the gain of the lead-lag filter 50 is adjusted so that it is flat up to a frequency f1, gradually increases at frequencies above the frequency f1, and then becomes flat at frequencies above a frequency f2. In the circuit configuration as shown in FIG. 6, the following formulas hold.

$$f1 = \frac{1}{2\pi R1C}$$

$$f2 = \frac{1}{2\pi[R1R2/(R1+R2)]C}$$

Figure 7A:
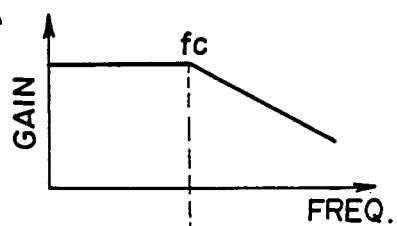
Figure 7B:
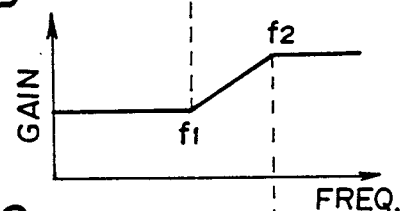

On the other hand, the gain of the APC circuit 8 is as shown in FIG. 7A. Specifically, the band is limited on the high frequency side for the reasons mentioned above. In the case where the cutoff frequency of the APC circuit 8 thus formed is designated by fc, the lead-lag filter 50 is constituted so that f1 is approximately equal to fc. Though the cutoff frequency of the APC circuit 8 is caused to fluctuate by fluctuations of the differential quantum efficiency as the gain of the semiconductor laser 1 in accordance with the optical output of the semiconductor laser 1, the frequency f1 is adjusted to be approximately equal to the lowest cutoff frequency, i.e. the cutoff frequency fc at the time the optical output of the semiconductor laser 1 is the lowest.

Figure 7C:
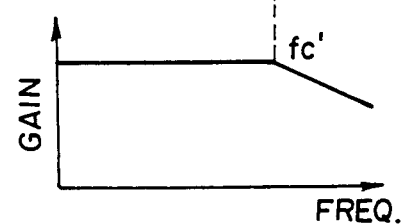

Since the lead-lag filter 50 as mentioned above is disposed in the stage prior to the APC circuit 8, the gain of the system from the lead-lag filter 50 to the APC circuit 8 becomes as shown in FIG. 7C. Specifically, the cutoff frequency of said system becomes equal to fc' (=f2), which value is on the frequency side higher than the cutoff frequency fc of the APC circuit 8, and thus the band of said system becomes wider than the band of the APC circuit 8. Therefore, the light emission response characteristics of the semiconductor laser 1 is improved by the extent corresponding to the widening of the band as compared with the case where no lead-lag filter 50 is provided. As the light emission response characterisitics of the semiconductor laser 1 is improved in this manner, the sharpness of the image recorded on the photosensitive material 20 in the manner mentioned above increases.

In the aforesaid embodiment, the V-P characteristics correction table 14 for making linear the relationship between the light emission level instructing signal S1″ and the optical output Pf is provided. However, in the case where the gain of the APC circuit 8 is adjusted to a substantially high level (for example, approximately 70dB), the ideal relationship as indicated by the solid line in FIG. 4 can be obtained by the APC circuit 8 alone, and the V-P characteristics correction table 14 mentioned above need not necessarily be provided.

Also, the beam scanning system for scanning the laser beam 4 is often provided with an optical element whose optical transmittance characteristics with respect to the incident light intensity are nonlinear, for example a polarizing filter, an interference filter, or an aperture stop plate. In such a case, the V-P characteristics correction table 14 should preferably be formed to compensate also for the nonlinearity of such characteristics.

Figure 8:
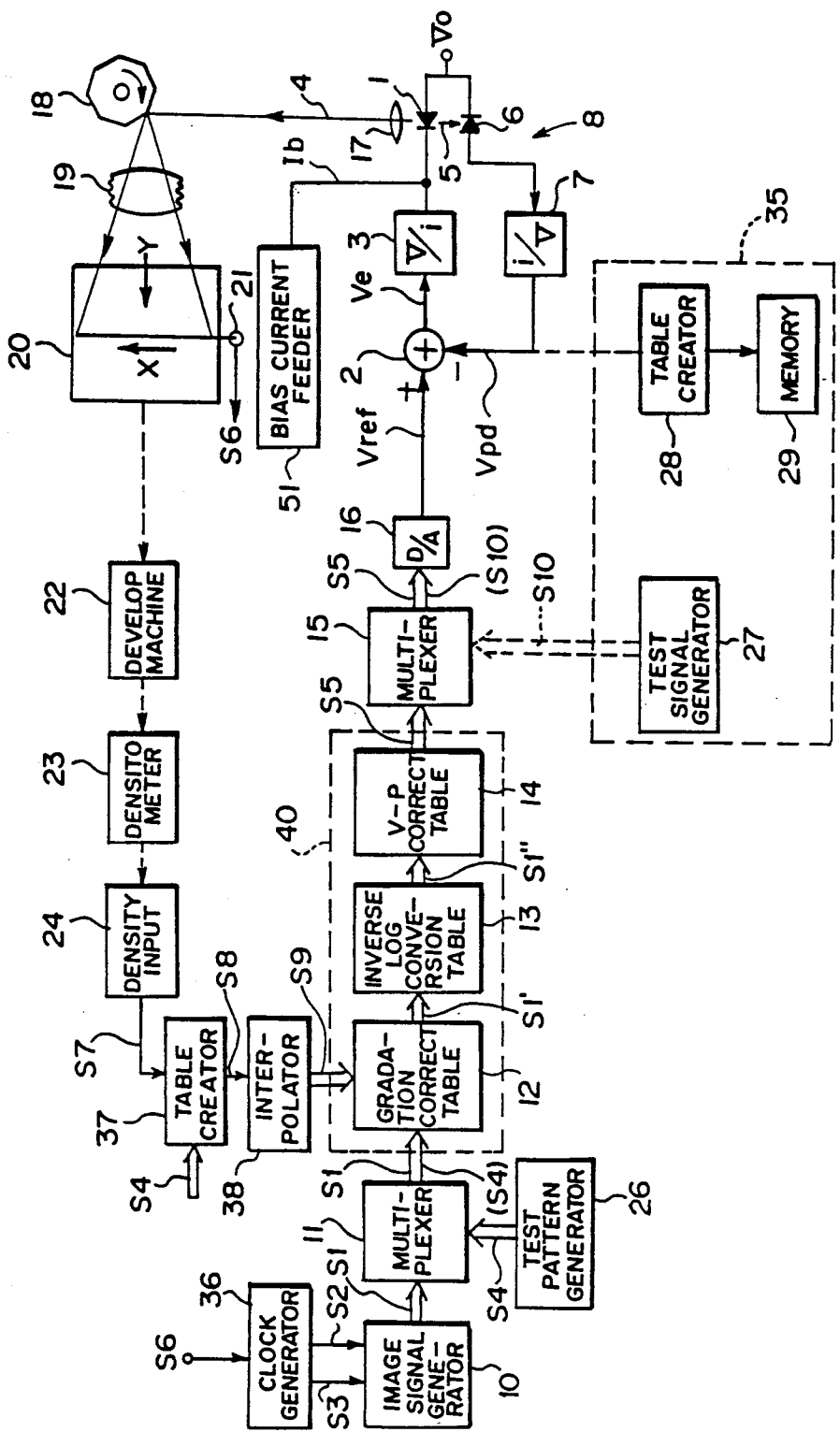
FIG. 8 is a schematic view showing an embodiment of the second laser beam recording apparatus in accordance with the present invention.

The second laser beam recording apparatus in accordance with the present invention will be described hereinbelow with reference to FIG. 8. In FIG. 8, similar elements are numbered with the same reference numerals with respect to FIG. 1.

With reference to FIG. 8, a bias current feed circuit 51 is connected to the semiconductor laser 1, and a bias current Ib of a predetermined level is always fed from the bias current feed circuit 51 to the semiconductor laser 1 in the course of operation of the apparatus. The bias current Ib is adjusted to a value smaller than the value of the semiconductor laser drive current that produces the laser beam 4 of the minimum optical intensity capable of exciting the photosensitive material 20. As the bias current Ib is being fed to the semiconductor laser 1, in the case where the light emission level instructing signal Vref for instructing the optical output in the laser oscillation region is given sharply from the condition when no light is being emitted as shown in FIG. 10A, the forward current of the semiconductor laser rises as indicated by the curve "e" in FIG. 10B. Specifically, the rise start point of the current is adjusted in advance to be higher by the level of the bias current Ib as compared with the case where no bias current is being fed as indicated by the solid line in FIG. 10B. Therefore, the rise response to the forward current of the semiconductor laser up to the predetermined level which the light emission level instructing signal Vref represents becomes quicker than in the case where no bias current is being fed. Accordingly, the rise response delay of the optical output of the semiconductor laser 1 is decreased as indicated by the curve "f" in FIG. 10C.

Besides the provision of the bias current feed circuit 51 as in the aforesaid embodiment, the correction table 40 may be adjusted to always apply a bias current of a predetermined level to the semiconductor laser 1.

When the rise response characteristics of the optical output of the semiconductor laser 1 are improved in the manner mentioned above, the duty ratio of the pulsed laser beam 4 emitted for each picture element becomes closer to the duty ratio of the light emission level instructing signal Vref. Accordingly, thinning of the line of the recorded image and deviation in the recording start position are minimized, no gap is caused in the recorded image, and the image, reproducibility is raised.

In the embodiment shown in FIG. 8, the V-P characteristics correction table 14 is provided for compensation for nonlinearity of the optical output characteristics of the semiconductor laser with respect to the light emission level instructing signal. However, in the second laser beam recording apparatus in accordance with the present invention, the V-P characteristics correction table 14 need not necessarily be provided.

We claim:

1. A laser beam recording method which comprises the following steps, in the course of obtaining a laser beam whose optical intensity is modulated by controlling a drive current for a semiconductor laser on the basis of a light emission level instructing signal corresponding to an image signal, and recording an image on a photosensitive material by scanning the laser beam on the photosensitive material:
    (i) stabilizing an optical output of said semiconductor laser by detecting the optical intensity of said laser beam and feeding back a feedback signal corresponding to the detected optical intensity to said light emission level instructing signal, and
    (ii) gradually increasing a gain in a stage prior to the stage for said optical output stabilization from near to a cutoff frequency in said optical output stabilization toward a higher frequency side.

2. A method as defined in claim 1 wherein said gradual increase of said gain is effected by use of a filter circuit.

3. A method as defined in claim 2 wherein said filter circuit is a lead-lag filter.

4. A laser beam recording apparatus provided with a semiconductor laser for emitting a laser beam, a beam scanning system for scanning the laser beam on a photosensitive material, and a laser operation control circuit for producing a light emission level instructing signal corresponding to an image signal, and controlling a drive current for the semiconductor laser on the basis of the light emission level instructing signal, thereby to modulate the optical intensity of the laser beam, wherein the improvement comprises providing said laser operation control circuit with:
(i) an optical output stabilizing circuit for detecting the optical intensity of said laser beam, and feeding back a feedback signal corresponding to the detected optical intensity to said light emission level instructing signal, and
(ii) a filter circuit disposed to allow the passage of said light emission level instructing signal therethrough in a stage prior to said optical output stabilizing circuit, and formed so that the gain gradually increases from near to a cutoff frequency of said optical output stabilizing circuit toward a higher frequency side.

5. An apparatus as defined in claim 4 wherein said filter circuit is a lead-lag filter.

6. A lser beam recording method which comprises the following steps, in the course of obtaining a laser beam whose optical intensity is modulated by controlling a drive current for a semiconductor laser on the basis of a light emission level instructing signal corresponding to an image signal, and recording an image on a photosensitive material by scanning the laser beam on the photosensitive material:
(i) stabilizing an optical output of said semiconductor laser by detecting the optical intensity of said laser beam and feeding back a feedback signal corresponding to the detected optical intensity to said light emission level instructing signal, and
(ii) always feeding a bias current of a value smaller than the value of said drive current, that produces said laser beam of the minimum optical intensity capable of exciting said photosensitive material, to said semiconductor laser,
wherein said feeding of said bias current to said semiconductor laser is effected by adjustment of a correction table which provides predetermined density value for image density values of said image on said photosensitive material for correcting said image signal wherein said adjustment is carried out based on the optical density of said image.

7. A method as defined in claim 6 wherein said feeding of said bias current to said semiconductor laser is effected by a bias current feed circuit connected to a stage prior to said semiconductor laser.

8. A laser beam recording apparatus provided with a semiconductor laser for emitting a laser beam, a beam scanning system for scanning the laser beam on a photosensitive material, and a laser operation control circuit for producing a light emission level instructing signal corresponding to an image signal, and controlling a drive current for the semiconductor laser on the basis of a light emission level instructing signal thereby to modulate the optical intensity of the laser beam, wherein the improvement comprises providing said laser operation control circuit with:
(i) an optical output stabilizing circuit for detecting the optical intensity of said laser beam, and feeding back a feedback signal corresponding to the detected optical intensity to said light emission level instructing signal, and
(ii) a bias current feed means for always feeding a bias current of a value smaller than the value of said drive current, that produces said laser beam of the minimum optical intensity capable of exciting said photosensitive material, to said semiconductor laser,
wherein said bias current feed means is constituted by a correction table for correcting said image signal.

9. An apparatus as defined in claim 8 wherein said bias current feed means is a bias current feed circuit connected to a stage prior to said semiconductor laser.

* * * * *

UNITED STATES PATENT AND TRADEMARK OFFICE
CERTIFICATE OF CORRECTION

PATENT NO. : 4,849,980

DATED : July 18, 1989

INVENTOR(S) : Shoji et al

It is certified that error appears in the above-identified patent and that said Letters Patent is hereby corrected as shown below:

First Page, Section [30] entitled "Foreign Application Priority Data", delete first priority claimed "61-310247".

Signed and Sealed this

Twenty-fifth Day of June, 1991

Attest:

HARRY F. MANBECK, JR.

Attesting Officer

Commissioner of Patents and Trademarks